US006307442B1

United States Patent
Meyer et al.

(10) Patent No.: US 6,307,442 B1
(45) Date of Patent: Oct. 23, 2001

(54) ENHANCED LC FILTER WITH TUNABLE Q

(75) Inventors: Robert G. Meyer, Berkeley; Madhu Avasarala, San Jose, both of CA (US)

(73) Assignee: Maxim Integrated Products, Sunnyvale, CA (US)

( * ) Notice: Subject to any disclaimer, the term of this patent is extended or adjusted under 35 U.S.C. 154(b) by 0 days.

(21) Appl. No.: 09/312,924

(22) Filed: May 17, 1999

(51) Int. Cl.[7] .................................................. H03H 11/10
(52) U.S. Cl. ........................ 333/17.1; 333/174; 333/217; 333/172
(58) Field of Search ................................ 333/174, 175, 333/17.1, 172, 217

(56) References Cited

U.S. PATENT DOCUMENTS

| | | |
|---|---|---|
| 3,079,571 | 2/1963 | Elliott et al. ........................... 333/174 |
| 4,600,903 | * 7/1986 | Temer ................................. 333/174 X |
| 5,550,520 | * 8/1996 | Kobayashi ......................... 333/217 X |

OTHER PUBLICATIONS

Silva–Martinez, J., Steyaert, M., Sansen W., "A 10.7–MHz 68–dB SNR CMOS Continuous–Time Filter with On–Chip Automatic Tuning," IEEE Journal of Solid–State Circuits, vol. 27, pp. 1843–1853, Dec., 1992.
Park, C., Schaumann, R., "Design of a 4–MHz Analog Integrated CMOS Transconductance–C Bandpass Filter," IEEE Journal of Solid–State Circuits, vol. 23, pp. 987–995, Aug. 1988.

Karni, S., Gengsheng Z., "The Analysis of the Continuous–Time LMS Algorithm", IEEE Transactions on Acoustics, Speech, and Signal Processing, vol. 37, pp. 595–597, Apr. 1989.
Stevenson, J., Sanchez–Sinencio, E., "A Practical Quality Factor Tuning Scheme for IF and High–Q Continuous–Time Filters," IEEE International Solid–State Circuits Conference, Feb. 1998, pp. 218–219.

* cited by examiner

Primary Examiner—Justin P. Bettendorf
(74) Attorney, Agent, or Firm—Oppenheimer Wolff & Donnelly, LLP

(57) ABSTRACT

A tunable electronic filter circuit is provided including an input terminal and an output terminal connected to the input terminal with a node therebetween. An inductor, a variable capacitor, and a variable resistor are connected between the node and ground. Coupled to the variable capacitor and the variable resistor is a feedback control circuit. The feedback control circuit is operable to tune the variable capacitor in order to set a predetermined frequency, or center frequency, of the electronic filter circuit. The feedback control circuit is further operable to tune the variable resistor in order to calibrate a quality factor of the electronic filter circuit. In use when an input signal is applied to the input terminal, the electronic filter circuit passes an output signal to the output terminal. Such output signal includes components of the input signal within a predetermined frequency bandwidth set by the predetermined frequency and filters out other components of the input signal. As an option, a "slave" tunable electronic filter circuit may be providing including a variable capacitor and a variable resistor which are also controlled by the feedback circuit. This allows the "slave" filter to be tuned while being used.

61 Claims, 4 Drawing Sheets

ENHANCED LC FILTER WITH TUNABLE Q

TECHNICAL FIELD

The present invention relates to electronic filters and more particularly pertains to a new enhanced LC filter capable of allowing the tuning of a frequency and the calibration of a quality factor of the LC filter.

BACKGROUND ART

Filters are commonly used in various electronic applications to filter out certain components of an electric signal. Prior Art FIG. 1 shows one example of a commonly known filter referred to as an LC filter. An LC filter basically includes an inductor element L and a capacitive element C combined in parallel.

During use, the LC filter substantially removes, i.e. filters, components of an input electric signal that reside out of a predetermined range, or in other words, are excessively distanced from a desired predetermined frequency, or center frequency $f_c$. This center frequency $f_c$ is shown in the graph of Prior Art FIG. 2. As shown in the graph, the LC filter suppresses an amplitude, or magnitude, of components of the electrical signal that are either to the right or left of the center frequency $f_c$. Given this feature, the center frequency $f_c$ of the LC filter may be changed by altering either the inductor element L or the capacitive element C, thereby letting only selected components of the electrical signal to pass.

Yet another aspect of LC filters that serves as a measure of how well an LC filters accomplishes its intended function is the quality factor Q of the LC filter. An LC filter that has a high quality factor Q tends to only pass components of an electrical signal that are very close to the center frequency $f_c$. With reference to Prior Art FIG. 2, a thinner curve which tightly encompasses the center frequency $f_c$ is indicative of a high quality factor Q. When designing an LC filter, the quality factor Q may be varied by introducing a parallel coupled resistive element R, as shown in Prior Art FIG. 1.

The foregoing LC filter is often referred to as a "bandpass" filter. It should be noted that other types of filters exist which operate under similar principles. For example, "lowpass" and "highpass" filters operate to pass only components of an electrical signal that are less than or greater than a cutoff frequency, respectively.

It thus becomes apparent that two very important features associated with all types of filters may each be controlled by manipulating the various elements of the filter. Prior art methods of manipulating such filter elements, however, are very primitive in that manipulation tends to be done manually. Further, the control of the center frequency $f_c$ and quality factor Q is usually carried out independently.

There is thus a need for an enhanced filter that allows the tuning of a frequency and further the calibration of a quality factor of the filter in an effective manner that may be carried out while the filter is in use.

DISCLOSURE OF THE INVENTION

The present invention comprises a tunable electronic filter circuit including an input terminal and an output terminal connected to the input terminal with a node therebetween. An inductor, a variable capacitor, and a variable resistor are connected between the node and ground. Coupled to the variable capacitor and the variable resistor is a feedback control circuit.

The feedback control circuit is operable to tune the variable capacitor in order to set a predetermined frequency, or center frequency, of the electronic filter circuit. The feedback control circuit is further operable to tune the variable resistor in order to calibrate a quality factor of the electronic filter circuit. In use when an input signal is applied to the input terminal, the electronic filter circuit passes an output signal to the output terminal. Such output signal includes components of the input signal within a predetermined frequency bandwidth set by the center frequency and filters out other components of the input signal. By this design, the present invention allows effective control of both the center frequency $f_c$ and quality factor Q of the filter circuit.

In the event that there is a need for controlling the center frequency $f_c$ and quality factor Q while the electronic filter circuit is being used, a "slave" tunable electronic filter circuit may be provided including a variable capacitor and a variable resistor which are also controlled by the feedback circuit. This allows the "slave" filter to be tuned while being used.

BRIEF DESCRIPTION OF THE DRAWINGS

The invention will be better understood when consideration is given to the following detailed description. Such description makes reference to the annexed drawings wherein.

Prior Art

Prior Art

BEST MODES FOR CARRYING OUT THE INVENTION

Figure 1:
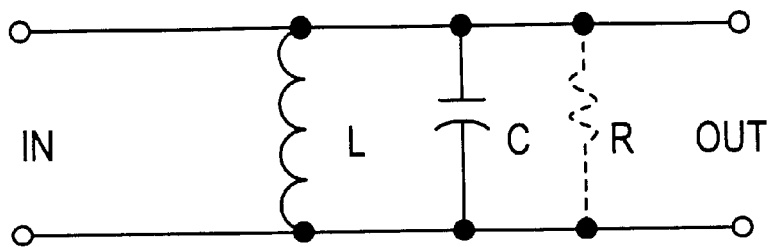
FIG. 1 is a schematic diagram of a prior art LC circuit.
Figure 2:
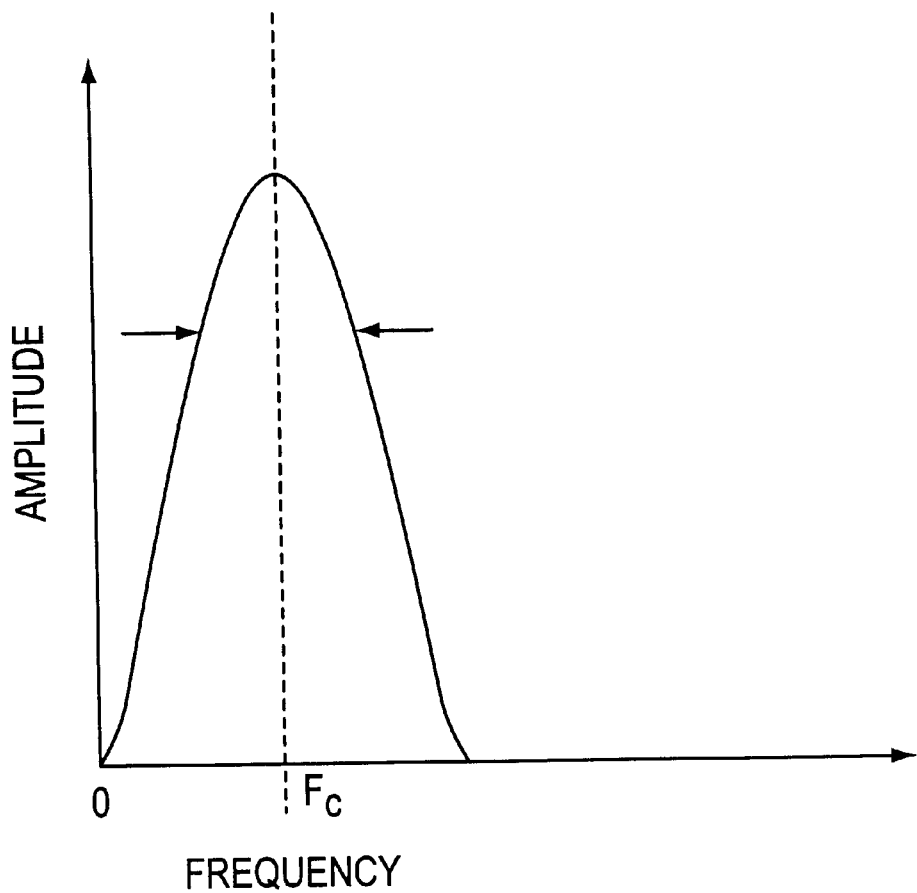
FIG. 2 is a graph delineating the amplitude vs. frequency of the prior art LC circuit of Prior Art FIG. 1.
Figure 3:
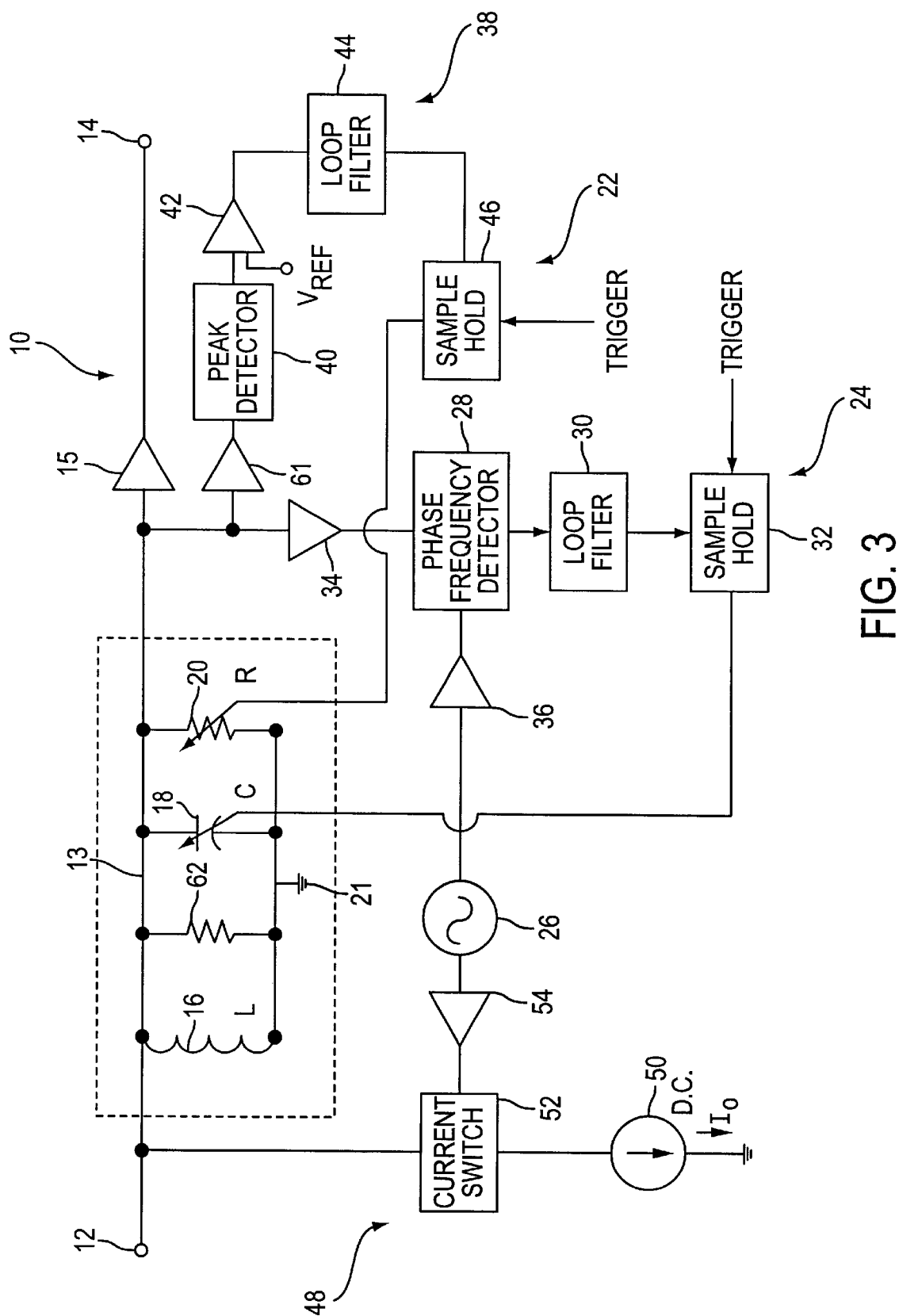
FIG. 3 is a schematic diagram of an enhanced filter with tunable Q according to one embodiment of the present invention.

FIGS. 1 and 2 show the prior art. With reference to FIG. 3, the present invention comprises a one-pole-pair LC electronic filter circuit 10 including a feedback control circuit 22 that in turn includes both a phase-locked loop 24 and a quality factor calibration loop 38.

The filter circuit 10 includes an input terminal 12, an output terminal 14, a node 13, an inductor 16, a variable capacitor 18, and a variable resistor 20. The node 13 is situated between the input terminal 12 and the output terminal 14. The output terminal 14 is buffered by a buffer 15. In the present description, the input terminal 12 and the node 13 are electrically equivalent. Further, in the absence of buffer 15, the output terminal 14 would be electrically equivalent to the input terminal 12 and the node 13. The inductor 16, variable capacitor 18, and variable resistor 20 are each coupled between the node 13 and a common ground reference 21. It should be noted that such interconnection between the node 13 and common ground reference 21 may include either a parallel or series connection. Further, the foregoing components may take on any form. For example, the variable capacitor 18 may include a varactor or any other electrical component or device that exhibits variable capacitance. Similarly, the variable resistor 20 may take any form as will be explained hereinafter in greater detail.

Coupled to the variable capacitor 18 and the variable resistor 20 is the feedback control circuit 22. In use, the feedback control circuit 22 is operable to tune the variable capacitor 18 in order to set a predetermined frequency of the electronic filter circuit 10. Subsequently, the feedback control circuit 22 is further operable to tune the variable resistor 20 in order to calibrate a quality factor Q of the electronic filter circuit 10. By this design, when an input signal is applied to the input terminal 12, the electronic filter circuit passes a uniquely filtered output signal to the output terminal 14.

Such output signal includes components of the input signal only within a predetermined frequency bandwidth set by the predetermined frequency. In one embodiment wherein the filter is a bandpass filter, such predetermined frequency is a center frequency $f_c$ and the predetermined frequency bandwidth is centered about the center frequency $f_c$. In another embodiment wherein the filter is a low or high pass filter, the predetermined frequency is a cutoff frequency and the predetermined frequency bandwidth is constrained by the cutoff frequency. In still yet another embodiment wherein the filter is a bandreject filter, the predetermined frequency sets a bandwidth which is undesired and a pair of bandwidths which are desired. In each of the mentioned embodiments, the filter substantially filters out components of the input signal that reside in at least one undesired bandwidth and further allows the passage of components of the input signal that reside in at least one desired bandwidth, wherein the predetermined frequency sets the undesired and desired bandwidths.

It should be noted that the various components of the present invention may be manufactured in any combination of discrete and/or integrated circuit components. Any portion, i.e. inductor 16, capacitor 18, resistor 20, feedback control circuit 10, of the tunable electronic filter circuit may be manufactured on an integrated circuit while any remaining components may be manufactured separate from the integrated circuit. For example, both the variable capacitor 18 and the inductor 16 may be positioned within the integrated circuit. In the alternative, the variable capacitor 18 may be positioned within the integrated circuit while the inductor 16 may be separate from the integrated circuit. In still yet another embodiment, the feedback control circuit 10 may be positioned within the integrated circuit with any number of the remaining components. This serves for improved accuracy which results from advanced integrated circuit manufacturing techniques.

In the present description, a "single-ended" implementation is set forth for the purpose of clarity and ease of understanding. It should be noted, however, that a more common implementation in an integrated circuit may include a full differential configuration.

In order for the feedback control circuit 22 to operate as intended, first included is a phase-locked loop 24 which in turn includes a local oscillator 26, a phase-frequency detector 28, a loop filter 30, and a sample and hold circuit 32. In particular, a first input of the phase-frequency detector 28 is connected to the node 13 and a second input of the phase-frequency detector 28 is connected to the local oscillator 26 via buffers 34 and 36, respectively. Prior to starting the tuning process, the variable resistor 20 is set such that the electronic filter circuit 10 becomes an oscillator with a frequency set by the inductor 16 and the variable capacitor 18. At the start of the tuning process, the phase-frequency detector 28 is operable to generate at an output thereof a difference signal. Such difference signal is representative of a difference between the output signal and a signal received from the local oscillator 26.

With continuing reference to FIG. 3, the loop filter 30 of the phase-locked loop 24 is shown to include an input that is connected to the output of the phase-frequency detector 28 for generating a constant integrated signal at the output of the loop filter 30. This constant integrated signal is representative of the difference signal from the phase-frequency detector 28. It should be noted that the loop filter 30 of the phase-locked loop 24 also serves to set the bandwidth of the loop.

An input of the sample and hold circuit 32 of the phase-locked loop 24 is connected to the output of the loop filter 30. Further, an output of the sample and hold circuit 32 is connected to the variable capacitor 18. In use, the sample and hold circuit 32 is operable to tune the variable capacitor 18 via a variable capacitor control signal. Such variable capacitor control signal is a function of the integrated signal from the loop filter 30. Specifically, the sample and hold circuit 32 samples the integrated signal from the loop filter 30 and holds the variable capacitor control signal upon the integrated signal indicating that the output signal and the signal received from the local oscillator 26 are substantially similar. The sample and hold circuit 32 may take on any form capable of accomplishing the associated function. For example, an application specific integrated circuit (ASIC), a comparator, or any other component or device may be employed. In summary, during frequency calibration, the predetermined frequency, or center frequency, of the electronic filter circuit 10 is focused in on the frequency of the local oscillator 26. In preparation of the quality factor calibration, the variable resistor 20 is set such that the electronic filter circuit 10 does not oscillate.

Yet another component of the feedback control circuit 22 is a quality factor calibration loop 38. FIG. 3 shows the quality factor calibration loop 38 to include a peak detector 40, a comparator 42, a loop filter 44, and a sample and hold circuit 46. A current generator 48 is provided for use with the quality factor calibration loop 38. Such current generator 48 includes a constant direct current source 50 which is connected to the input terminal 12 of the electronic filter circuit 10 via a current switch 52. This current switch 52 is in turn connected to the local oscillator 26 by way of another buffer 54.

In use, the current generator 48 provides an input signal having a frequency substantially similar to the predetermined frequency, or center frequency. This input signal in turn effects a non-zero output signal with the appropriate center frequency that is required for quality factor calibration. For accuracy purposes, the current source may be manufactured on an integrated circuit.

Figure 4:
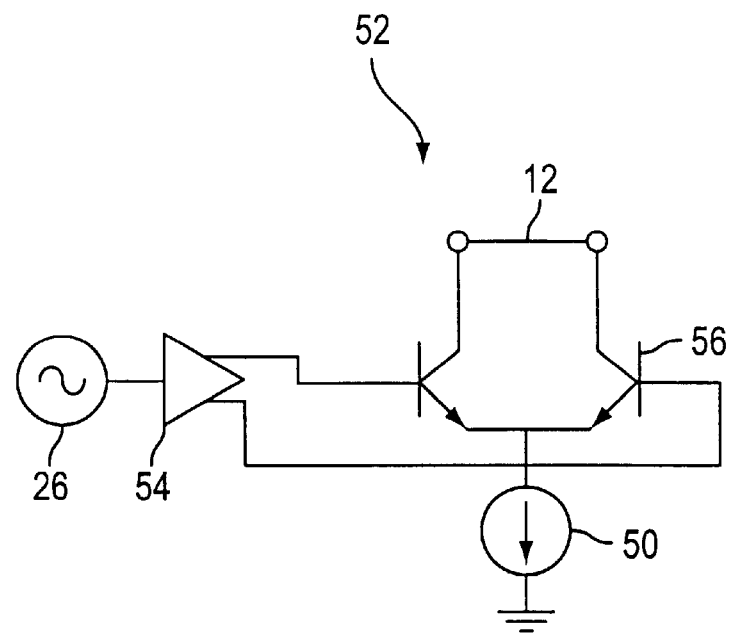
FIG. 4 is a schematic diagram of a current switch of the enhanced filter shown in FIG. 3.

While the current switch 52 may take on many forms, it could include a pair of transistors 56, as shown in FIG. 4, with base terminals connected to the local oscillator 26 via the buffer 54. Further, collector terminals of the transistors 56 may be connected to the input terminal 12 of the electronic filter circuit 10 and emitter terminals may be connected to ground via a current source 50 at the predetermined frequency, or center frequency. This, in turn, ensures that both an input and output signal of the electronic filter circuit 10 have a similar center frequency.

An important aspect of the current switch is to generate a square wave of reference current. The amplitude and duty cycle of the resulting current at the desired center frequency are thus carefully controlled and result in establishing precise relationships in the quality factor setting process, as will become apparent hereinafter.

As shown in FIG. 3, an input of the peak detector 40 of the quality factor calibration loop 38 is connected to the node 13 of the electronic filter circuit 10 for generating at an output thereof a peak signal. Ideally, such interconnection between the peak detector 40 and the node 13 is buffered via buffer 61. The peak signal is representative of a maximum voltage level of the output signal at the node 13.

A first input of the comparator 42 of the quality factor calibration loop 38 is connected to the output of the peak detector 40 and a second input of such comparator 42 is connected to a reference voltage $V_{REF}$. The comparator 42 is operable for generating at an output thereof a difference signal which is representative of a difference between the peak signal and the reference voltage $V_{REF}$.

Similar to the phase-locked loop 24, the quality factor calibration loop 38 is equipped with a loop filter 44 the input of which is connected to an output of the comparator 42 for generating a constant integrated signal representative of the difference signal from the comparator 42. Associated therewith is the sample and hold circuit 46 which has an input connected to the output of the loop filter 44. An output of the sample and hold circuit 46 is connected to the variable resistor 20. During operation, the sample and hold circuit 46 is operable to tune the variable resistor 20 via a variable resistor control signal that is a function of the integrated signal from the loop filter 44. Specifically, the sample and hold circuit 46 serves to sample the integrated signal from the loop filter 44 and hold the variable resistor control signal upon the integrated signal indicating that the peak signal and the reference voltage $V_{REF}$ are substantially similar.

During quality factor calibration, the following equations hold true:

$$I_0 = V_{BG}/R_P V_{REF} K_1 * V_{BG}$$

$$R_T = (K_3 * K_1 * V_{BG} * R_P)/K_2 * V_{BG} = 2 * \pi * f_0 * L * Q$$

where, $I_0$ is a precise direct current derived on an integrated circuit $V_{BG}$ is a precise band gap voltage generated on an integrated circuit $R_P$ is a precise resistor either located separate from an integrated circuit or trimmed on an integrated circuit $V_{REF}$ is a precise reference voltage derived on an integrated circuit from the band gap voltage $V_{BG}$ $R_T$ is the resistance necessary to achieve the desired loaded quality factor Q L is the precise inductance either on or separate from an integrated circuit $K_1$, $K_2$, and $K_3$ are precise constants: $K_1$ is set by a resistor ratio, $K_2$ is the ratio of the fundamental harmonic to the peak value of the switched current waveform $I_0$ and is constant, and $K_3$ is the peak detector gain and is made to depend on a resistor ratio, also a constant.

Therefore, a precise quality factor Q is established independent of process, supply voltage, and temperature. It should be noted that the band gap voltage $V_{BG}$ does not have to be absolutely determined since it gets cancelled in the expression for $R_T$. The control voltage to achieve the desired Q as set up by the loop is stored in the sample and hold circuit 46 whereafter the Q calibration circuitry is then powered down and ready for operation.

The foregoing circuitry results in a maximum voltage of the output signal to be centered at the center frequency tuned by the phase-locked loop 24, thereby enhancing the quality factor Q which is calculated as follows: $Q = R_T/(L*\omega_0)$. Such quality factor Q may be increased from levels in the order of 50 to levels in the order of 160 or 200 by employing various negative values of resistance R.

Negative values of resistance R may be achieved using a tunnel diode, a negative-impedance converter, or any other component or device capable of exhibiting negative resistance. The negative resistance R may be made variable either by current control or by feedback capacitance control.

Figure 4A:
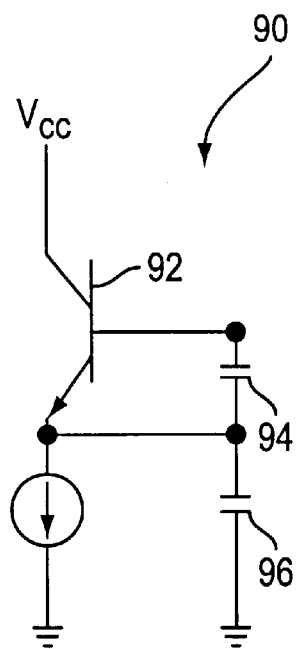
FIG. 4a is a schematic diagram of a Colpitt's negative resistor cell.

For implementations at VHF and UHF frequencies, the negative resistance may be implemented as a Colpitt's cell or a coupled pair. Thus the implementation resembles closely to that of a VCO except that the Q is carefully controlled. A Colpitt's negative resistor cell 90 is shown in FIG. 4a to include a transistor 92 with a base terminal adapted for being connected to the quality factor calibration loop 38. Further, a collector terminal of the transistor 92 may be connected to VCC and a emitter terminal may be connected to ground. Associated with the transistor 92 is a capacitor bank including a first capacitor 94 having a first terminal connected to the base terminal of the transistor 92 and a second terminal connected to a first terminal of a second capacitor 96 which has a second terminal connected to ground. Lastly, the Colpitt's negative resistor cell 90 may include a tie between the second terminal of the first capacitor 94 and the emitter terminal of the transistor 92.

It is the negative resistance that compensates for a shunt resistance 62 of the filter that, in turn, affords the improved quality factor Q. Once both the frequency tuning and quality factor calibration is complete, the related loops may be powered down for power conservation purposes.

Figure 5:
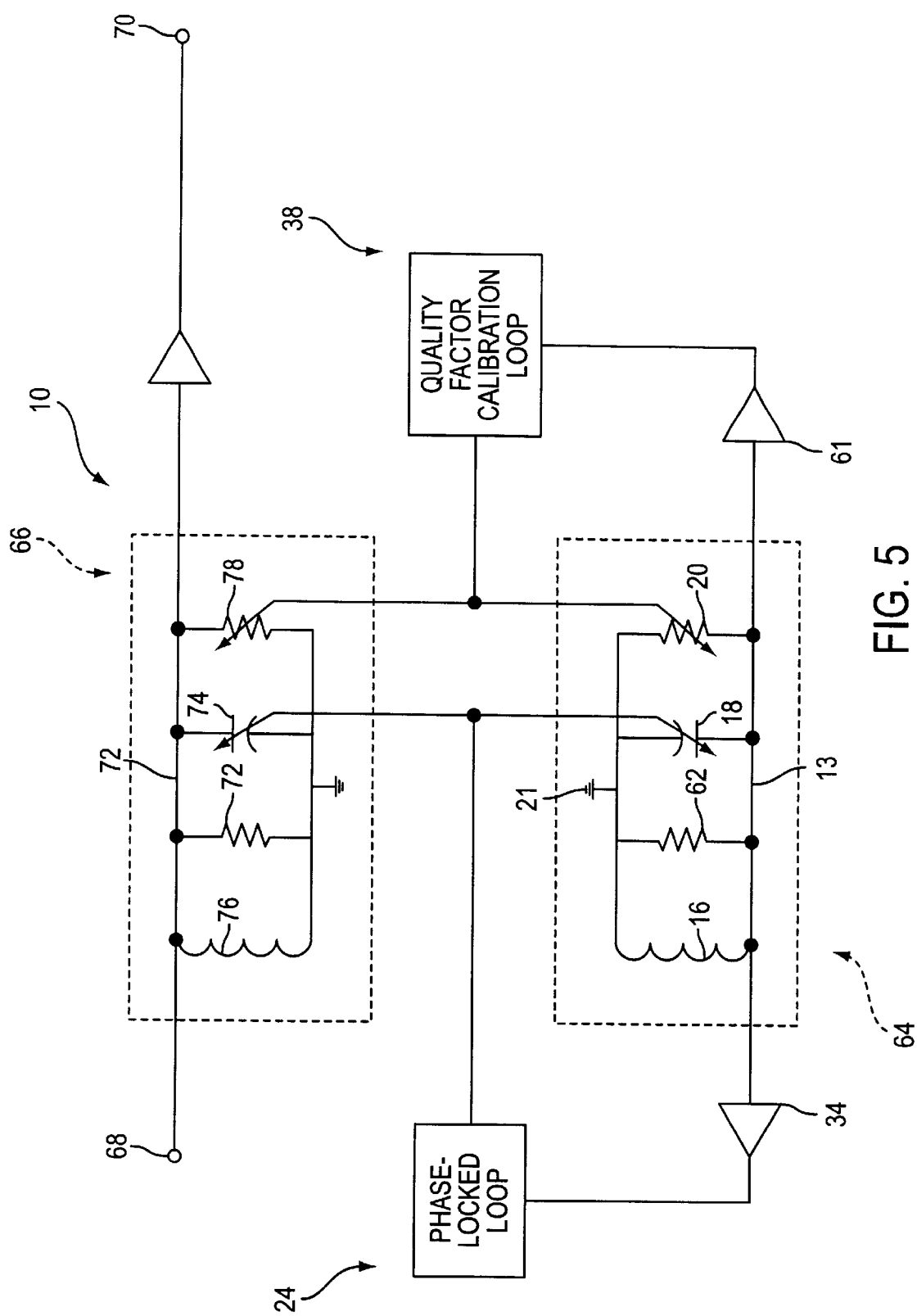
FIG. 5 is a schematic diagram of an alternate embodiment of the present invention wherein a "slave" tunable filter is incorporated with a "master" tunable filter similar to that shown in FIG. 3.

In an alternate embodiment of the present invention, the forgoing components are employed as a "master" electronic filter circuit 64. As shown in FIG. 5, in addition to the "master" electronic filter circuit 64 is a "slave" electronic filter circuit 66. Similar to the "master" electronic filter circuit 64, the "slave" electronic filter circuit 66 includes a second input terminal 68, a second output terminal 70 connected to the second input terminal 68 with a second node 72 therebetween, and a second variable capacitor 74, a second inductor 76, and a second variable resistor 78 each coupled between the second node 72 and the common ground reference.

As shown in FIG. 5, the feedback control circuit 22 is connected to the second variable capacitor 74 and the second variable resistor 78 in a manner similar to that in which it is connected to the variable capacitor 18 and the variable resistor 20 of the "master" electronic filter circuit 64. In use, the feedback control circuit 22 serves to tune the second variable capacitor 74 such that the "slave" electronic filter circuit 66 exhibits the predetermined frequency. In addition, the feedback control circuit 22 is operable to tune the second variable resistor 78 in order to calibrate the quality factor of the "slave" electronic filter circuit 66. In order to achieve ideal operation, it is important that the "master" and "slave" electronic filter circuits 64 and 66 are identical. This is best accomplished through the use of integrated circuits. The "slave" electronic filter circuit 66 may thus be used in any application where continuous operation is mandated.

It should be noted that the various components of the present embodiment of FIG. 5 may be manufactured in any combination of discrete and/or integrated circuit components. For example, the "master" electronic filter circuit 64 may be manufactured on an integrated circuit while the "slave" electronic filter circuit 66 may be manufactured separate from the integrated circuit or visa-versa or in any other combination.

In yet another alternate embodiment, the filter set forth hereinabove may be employed as an adjustable load circuit. During operation of the present embodiment, the control circuit is operable to tune the variable capacitor for varying a reactance of the load circuit. Further, the control circuit is operable to tune the variable resistor for varying a resistance of the load circuit. As such, when an input signal is applied to the input terminal, an output signal that is generated at the output terminal may be manipulated by varying the reactance and the resistance of the load circuit.

The present invention may be employed in a number of various applications. For example, the present electronic filter circuit 10 may be used as a tuned load for a down conversion mixer to attenuate adjacent channels with very wide dynamic range. Further, the present invention may obviate the need for expensive and bulky off-chip filters. Other applications include, but are not limited to tracking tuned loads for LO buffers prior to quadrature phase shifters for precise quadrature for I/Q transceivers, tracking tuned filters for radio and intermediate frequency image rejection, adjacent channel and blocker signal rejection, selection of desired harmonic from a comb signal to realize signal frequency multipliers, etc.

Although only a few embodiments of the present invention have been described in detail herein, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A tunable electronic filter circuit comprising:
   an input terminal;
   an output terminal connected to the input terminal with a node therebetween;
   a variable capacitor coupled between the node and a common ground reference;
   an inductor coupled between the node and the common ground reference;
   a resistor coupled between the node and the common ground reference;
   a feedback control circuit coupled to the variable capacitor, the feedback control circuit operable to tune the variable capacitor in order to set a predetermined frequency of the electronic filter circuit, wherein the feedback control circuit includes a quality factor calibration loop, wherein the quality factor calibration loop includes a peak detector;
   whereby when an input signal is applied to the input terminal, the electronic filter circuit passes an output signal to the output terminal which includes components of the input signal within a predetermined frequency bandwidth set by the predetermined frequency while substantially filtering out other components of the input signal.

2. The electronic filter circuit as recited in claim 1 wherein the variable capacitor is a varactor.

3. The electronic filter circuit as recited in claim 2 wherein a portion of the electronic filter circuit is manufactured on an integrated circuit, the varactor being formed upon the integrated circuit.

4. The electronic filter circuit as recited in claim 2 wherein a portion of the electronic filter circuit is manufactured on an integrated circuit, the varactor being formed separate from the integrated circuit.

5. The electronic filter circuit as recited in claim 1 wherein a portion of the electronic filter circuit is manufactured on an integrated circuit, the variable capacitor being formed upon the integrated circuit.

6. The electronic filter circuit as recited in claim 1 wherein a portion of the electronic filter circuit is manufactured on an integrated circuit, the variable capacitor being formed separate from the integrated circuit.

7. The electronic filter circuit as recited in claim 1 wherein a portion of the electronic filter circuit is manufactured on an integrated circuit, the inductor being formed upon the integrated circuit.

8. The electronic filter circuit as recited in claim 1 wherein a portion of the electronic filter circuit is manufactured on an integrated circuit, the inductor being formed separate from the integrated circuit.

9. The electronic filter circuit as recited in claim 1 wherein a portion of the electronic filter circuit is manufactured on an integrated circuit, the resistor being formed upon the integrated circuit.

10. The electronic filter circuit as recited in claim 1 wherein a portion of the electronic filter circuit is manufactured on an integrated circuit, the resistor being formed separate from the integrated circuit.

11. The electronic filter circuit as recited in claim 1 wherein the variable capacitor, the inductor, and the resistor are formed on an integrated circuit.

12. The electronic filter circuit as recited in claim 11 wherein at least a portion of the feedback control circuit is formed on the integrated circuit.

13. The electronic filter circuit as recited in claim 1 wherein the feedback control circuit is formed on an integrated circuit.

14. The electronic filter circuit as recited in claim 1 wherein the feedback control circuit includes a phase-locked loop.

15. The electronic filter circuit as recited in claim 14 wherein the phase-locked loop includes a local oscillator, a phase-frequency detector, a loop filter, and a sample and hold circuit.

16. The electronic filter circuit as recited in claim 15 wherein a frequency of the local oscillator defines the predetermined frequency.

17. The electronic filter circuit as recited in claim 15 wherein a first input of the phase-frequency detector is connected to the node a second input of the phase-frequency detector is connected to the local oscillator, the phase-frequency detector operable to generate at an output thereof a difference signal which is representative of a difference between the output signal and a signal received from the local oscillator.

18. The electronic filter circuit as recited in claim 17 wherein an input of the loop filter is connected to the output of the phase-frequency detector for generating at an output thereof a constant integrated signal representative of the difference signal from the phase-frequency detector.

19. The electronic filter circuit as recited in claim 18 wherin an input of the sample and hold circuit is connected to the outpu of the loop filter and an output of the sample and hold circuit is connected to the variable capacitor, the sample and hold circuit operable to tune the variable capacitor via a variable capacitor control signal which is a function of the integrated signal from the loop filter, the sample and hold circuit further operable to sample the integrated signal from the loop filter and hold the variable capacitor control signal upon the integrated signal indicating that the output signal and the signal received from the local oscillator are substantially similar.

20. The electronic filter circuit as recited in claim 1 wherein the electronic filter circuit is a master electronic filter circuit and further comprising a slave electronic filter circuit including a second input terminal, a second output terminal connected to the second input terminal with a second node therebetween, a second variable capacitor coupled between the second node and the common ground reference, a second inductor coupled between the second node and the common ground reference, a second resistor coupled between the second node and the common ground reference, wherein the feedback control circuit is connected to the second variable capacitor, the feedback control circuit operable to tune the second variable capacitor in order to set a predetermined frequency of the slave electronic filter circuit.

21. A tunable electronic filter circuit comprising:
   an input terminal;
   an output terminal connected to the input terminal with a node therebetween;
   a variable capacitor coupled between the node and a common ground reference;
   an inductor coupled between the node and the common ground reference;
   a variable resistor coupled between the node and the common ground reference;
   a feedback control circuit coupled to the variable resistor, the feedback control circuit further operable to tune the variable resistor in order to calibrate a quality factor of the electronic filter circuit, wherein the feedback control circuit includes a quality factor calibration loop, wherein the quality factor calibration loop includes a peak detector;
   whereby when an input signal is applied to the input terminal, the electronic filter circuit passes an output signal to the output terminal which includes components of the input signal within a predetermined frequency bandwidth set by a predetermined frequency while substantially filtering out other components of the input signal.

22. The electronic filter circuit as recited in claim 21 wherein a portion of the electronic filter circuit is manufactured on an integrated circuit, the capacitor being formed upon the integrated circuit.

23. The electronic filter circuit as recited in claim 21 wherein a portion of the electronic filter circuit is manufactured on an integrated circuit, the capacitor being formed separate from the integrated circuit.

24. The electronic filter circuit as recited in claim 21 wherein a portion of the electronic filter circuit is manufactured on an integrated circuit, the inductor being formed upon the integrated circuit.

25. The electronic filter circuit as recited in claim 21 wherein a portion of the electronic filter circuit is manufactured on an integrated circuit, the inductor being formed separate from the integrated circuit.

26. The electronic filter circuit as recited in claim 21 wherein a portion of the electronic filter circuit is manufactured on an integrated circuit, the variable resistor being formed upon the integrated circuit.

27. The electronic filter circuit as recited in claim 21 wherein a portion of the electronic filter circuit is manufactured on an integrated circuit, the variable resistor being formed separate from the integrated circuit.

28. The electronic filter circuit as recited in claim 21 wherein the capacitor, the inductor, and the variable resistor are formed on an integrated circuit.

29. The electronic filter circuit as recited in claim 21 wherein at least a portion of the feedback control circuit is formed on the integrated circuit.

30. The electronic filter circuit as recited in claim 21 wherein the feedback control circuit is formed on an integrated circuit.

31. The electronic filter circuit as recited in claim 21 wherein the feedback control circuit includes a current generator.

32. The electronic filter circuit as recited in claim 31 wherein the quality factor calibration loop includes a comparator, a loop filter, and a sample and hold circuit.

33. The electronic filter circuit as recited in claim 32 wherein the current generator inputs a current at the input terminal with such current having a frequency substantially similar to the predetermined frequency, thereby generating the output signal with a non-zero magnitude.

34. The electronic filter circuit as recited in claim 33 wherein an input of the peak detector is connected to the node for generating at an output thereof a peak signal representative of a maximum voltage level of the output signal at the node.

35. The electronic filter circuit as recited in claim 34 wherein a first input of the comparator is connected to the output of the peak detector and a second input of the comparator is connected a reference voltage, the comparator operable for generating at an output thereof a difference signal which is representative of a difference between the peak signal and the reference voltage.

36. The electronic filter circuit as recited in claim 35 wherein an input of the loop filter is connected to an output of the comparator for generating at an output thereof a constant integrated signal representative of the difference signal from the comparator.

37. The electronic filter circuit as recited in claim 36 wherein an input of the sample and hold circuit is connected to the output of the loop filter and an output of the sample and hold circuit is connected to the variable resistor, the sample and hold circuit operable to tune the variable resistor via a variable resistor control signal which is a function of the integrated signal from the loop filter, the sample and hold circuit further operable to sample the integrated signal from the loop filter and hold the variable resistor control signal upon the integrated signal indicating that the peak signal and the reference voltage are substantially similar.

38. The electronic filter circuit as recited in claim 21 wherein the electronic filter circuit is a master electronic filter circuit and further comprising a slave electronic filter circuit including a second input terminal, a second output terminal connected to the second input terminal with a second node therebetween, a second capacitor coupled between the second node and the common ground reference, a second inductor coupled between the second node and the common ground reference, a second variable resistor coupled between the second node and the common ground reference, wherein the feedback control circuit is connected to the second variable resistor, the feedback control circuit operable to tune the second variable resistor in order to calibrate the quality factor of the slave electronic filter circuit.

39. A method of controlling a electronic filter circuit including a variable capacitor, the method comprising:

tuning the variable capacitor of the electronic filter circuit to adjust a predetermined frequency thereof, feeding back a quality factor in a calibration loop, wherein the quality factor calibration loop includes a peak detector;

whereby when an input signal is applied, the electronic filter circuit passes an output signal which includes components of the input signal within a predetermined frequency bandwidth set by the predetermined frequency while substantially filtering out other components of the input signal.

40. The method as set forth in claim 39 comprising:

comparing a fixed frequency and the predetermined frequency; and tuning the variable capacitor to adjust the predetermined frequency until the fixed frequency and the predetermined frequency are substantially similar.

41. The method as set forth in claim 40 comprising:

utilizing a phase-locked loop to tune the variable capacitor.

42. The method as set forth in claim 40 wherein a difference between the fixed frequency and the predetermined frequency is sampled until the difference is substantially zero at which time the variable capacitor is no longer tuned.

43. The method as set forth in claim 39 comprising:

providing a second electronic filter circuit with a variable capacitor;

tuning the variable capacitor of the second electronic filter circuit in a manner substantially similar to a manner in which the variable capacitor of the first electronic filter circuit is tuned such that a predetermined frequency of the second electronic filter circuit substantially coincides with that of the first electronic filter circuit.

44. A method of controlling an electronic filter circuit including a variable resistor, the method comprising:

tuning the variable resistor of the electronic filter circuit to adjust a quality factor thereof, feeding back a quality factor in a calibration loop, wherein the quality factor calibration loop includes a peak detector;

whereby when an input signal is applied, the electronic filter circuit passes an output signal which includes components of the input signal within a predetermined frequency bandwidth set by a predetermined frequency of the electronic filter circuit while substantially filtering out other components of the input signal.

45. The method as set forth in claim 44 comprising:

comparing a maximum output voltage of the electronic filter circuit and a reference voltage; and tuning the variable resistor to adjust the maximum output voltage until the maximum output voltage of the electronic filter circuit and the reference voltage are substantially the same.

46. The method as set forth in claim 45 comprising:

utilizing a current generator, a comparator, a loop filter, and a sample and hold circuit to tune the variable resistor.

47. The method as set forth in claim 45 wherein a difference between the maximum output voltage of the electronic filter circuit and the reference voltage is sampled until the difference is substantially zero at which time the variable resistor is no longer tuned.

48. The method as set forth in claim 44 comprising:

providing a second electronic filter circuit with a variable resistor;

tuning the variable resistor of the second electronic filter circuit in a manner substantially similar to a manner in which the variable resistor of the first electronic filter circuit is tuned such that the quality factor of the second electronic filter circuit substantially coincides with that of the first electronic filter circuit.

49. An adjustable load circuit with variable reactance comprising:

an input terminal;

an output terminal connected to the input terminal with a node therebetween;

a variable capacitor coupled between the node and a common ground reference;

an inductor coupled between the node and the common ground reference;

a resistor coupled between the node and the common ground reference;

a control circuit coupled to the variable capacitor, the control circuit operable to tune the variable capacitor for varying a reactance of the load circuit; wherein the control circuit includes a quality factor calibration loop, wherein the quality factor calibration loop includes a peak detector;

whereby when an input signal is applied to the input terminal, an output signal is generated at the output terminal which may be varied by varying the reactance of the load circuit.

50. The adjustable load circuit as recited in claim 49 wherein at least a portion of the adjustable load circuit is manufactured on an integrated circuit.

51. The adjustable load circuit as recited in claim 50 wherein at least a portion of the adjustable load circuit is formed separate from the integrated circuit.

52. The adjustable load circuit as recited in claim 49 wherein the control circuit includes a phase-locked loop.

53. The adjustable load circuit as recited in claim 52 wherein the phase-locked loop includes a local oscillator, a phase-frequency detector, a loop filter, and a sample and hold circuit.

54. The adjustable load circuit as recited in claim 49 wherein the adjustable load circuit is a master load circuit and further comprising a slave load circuit including a second input terminal, a second output terminal connected to the second input terminal with a second node therebetween, a second variable capacitor coupled between the second node and the common ground reference, a second inductor coupled between the second node and the common ground reference, a second resistor coupled between the second node and the common ground reference, wherein the control circuit is connected to the second variable capacitor, the control circuit operable to tune the second variable capacitor for varying a reactance of the slave load circuit.

55. An adjustable load circuit with variable resistance comprising:

an input terminal;

an output terminal connected to the input terminal with a node therebetween;

a capacitor coupled between the node and a common ground reference;

an inductor coupled between the node and the common ground reference;

a variable resistor coupled between the node and the common ground reference;

a control circuit coupled to the variable resistor, the control circuit further operable to tune the variable resistor for varying a resistance of the load circuit, wherein the control circuit includes a quality factor calibration loop, wherein the quality factor calibration loop includes a peak detector;

whereby when an input signal is applied to the input terminal, an output signal is generated at the output terminal which may be varied by varying the resistance of the load circuit.

56. The adjustable load circuit as recited in claim 55 wherein at least a portion of the adjustable load circuit is manufactured on an integrated circuit.

57. The adjustable load circuit as recited in claim 56 wherein at least a portion of the adjustable load circuit is formed separate from the integrated circuit.

58. The adjustable load circuit as recited in claim 55 wherein the control circuit includes a current generator.

59. The adjustable load circuit as recited in claim 58 wherein the calibration loop includes a comparator, a loop filter, and a sample and hold circuit.

60. The adjustable load circuit as recited in claim 59 wherein the adjustable load circuit is a master load circuit and further comprising a slave load circuit including a second input terminal, a second output terminal connected to the second input terminal with a second node therebetween, a second capacitor coupled between the second node and the common ground reference, a second inductor coupled between the second node and the common ground reference, a second variable resistor coupled between the second node and the common ground reference, wherein the control circuit is connected to the second variable resistor, the control circuit further operable to tune the second variable resistor for varying a resistance of the slave load circuit.

61. A method of controlling an adjustable load circuit including a variable capacitor and a variable resistor, the method comprising:

adjusting the variable capacitor of the load circuit to adjust a reactance of the load circuit for the purpose of varying an output signal at the load circuit; and adjusting the variable resistor of the load circuit to adjust a resistance of the load circuit for the purpose of varying the output signal at the load circuit, feeding back a quality factor in a calibration loop, wherein the quality factor calibration loop includes a peak detector.

* * * * *

UNITED STATES PATENT AND TRADEMARK OFFICE
CERTIFICATE OF CORRECTION

PATENT NO. : 6,307,442 B1
DATED : October 23, 2001
INVENTOR(S) : Robert G. Meyer et al.

It is certified that error appears in the above-identified patent and that said Letters Patent is hereby corrected as shown below:

Column 2,
Line 66 reads: "the variable capacitor 18 may include a varactor or any other";
It should read: -- the variable capacitor 18 may include a varacitor or any other --;

Column 5,
Line 37 reads: "$I_O=V_{BG}/R_P V_{REF} K_1*V_{BG}$" it should read: -- $I_O=V_{BG}/R_P\ V_{REF}=K_1*V_{BG}$ --;

Column 8,
Line 63 reads: "to the outpu of the loop filter and an output of the sample and"
It should read: -- to the output of the loop filter and an output of the sample and --;

Signed and Sealed this

Twenty-first Day of May, 2002

Attest:

JAMES E. ROGAN
*Attesting Officer*  *Director of the United States Patent and Trademark Office*